United States Patent
Huang et al.

(10) Patent No.: US 11,874,989 B2
(45) Date of Patent: Jan. 16, 2024

(54) TOUCH SCREEN, DISPLAY PANEL, AND VEHICLE DIAGNOSIS EQUIPMENT

(71) Applicant: AUTEL INTELLIGENT TECHNOLOGY CORP., LTD., Guangdong (CN)

(72) Inventors: Chang Huang, Guangdong (CN); Huaming Chen, Guangdong (CN)

(73) Assignee: AUTEL INTELLIGENT TECHNOLOGY CORP., LTD., Guangdong (CN)

( * ) Notice: Subject to any disclaimer, the term of this patent is extended or adjusted under 35 U.S.C. 154(b) by 0 days.

(21) Appl. No.: 17/655,481

(22) Filed: Mar. 18, 2022

(65) Prior Publication Data

US 2022/0206654 A1    Jun. 30, 2022

Related U.S. Application Data

(63) Continuation of application No. PCT/CN2020/116256, filed on Sep. 18, 2020.

(30) Foreign Application Priority Data

Sep. 20, 2019   (CN) .......................... 201910895135.1

(51) Int. Cl.
*G06F 3/041* (2006.01)
*G07C 5/08* (2006.01)

(52) U.S. Cl.
CPC ........ *G06F 3/04164* (2019.05); *G06F 3/0412* (2013.01); *G07C 5/0808* (2013.01)

(58) Field of Classification Search
CPC .. G06F 3/04164; G06F 3/0412; G07C 5/0808
See application file for complete search history.

(56) References Cited

U.S. PATENT DOCUMENTS

2013/0021268 A1   1/2013  Lee et al.
2017/0176835 A1*  6/2017  Gupta ................. G02B 6/0036
(Continued)

FOREIGN PATENT DOCUMENTS

CN    103336597 A    10/2013
CN    205193755 U    4/2016
(Continued)

OTHER PUBLICATIONS

International search report of PCT/CN2020/116256 dated Dec. 16, 2020.

*Primary Examiner* — Peter D Mcloone

(57) ABSTRACT

A touch screen, a display panel, and a vehicle diagnosis equipment. The touch screen (100) is applied to the vehicle diagnosis equipment. The touch screen (100) comprises: a touch assembly (20) and a metal support (40). The touch assembly (20) comprises a touch function layer (22) and a flexible circuit board (24). The touch function layer (22) is electrically connected to the flexible circuit board (24). The flexible circuit board (24) is provided with a first grounding portion (26). The first grounding portion (26) is electrically connected to the flexible circuit board (24). The metal support (40) is grounded, and the metal support (40) is provided with a second grounding portion (42). The first grounding portion (26) is electrically connected to the second grounding portion (42). By providing the first grounding portion (26) on the flexible circuit board (24), electrically connecting the first grounding portion (26) to the flexible circuit board (24), providing the second grounding portion (42) on the metal support (40), and electrically connecting the first grounding portion (26) to the second grounding portion (42), a touch assembly can be grounded to enable peripheral wires to be not prone to burnout due to (Continued)

short circuit or electrostatic breakdown, thereby improving the anti-static performance of the touch screen (100).

13 Claims, 2 Drawing Sheets

(56) References Cited

U.S. PATENT DOCUMENTS

| | | | | |
|---|---|---|---|---|
| 2020/0196452 A1* | 6/2020 | Lee | ........................ | H05K 1/189 |
| 2021/0223934 A1* | 7/2021 | Kim | .................... | G06F 3/04164 |

FOREIGN PATENT DOCUMENTS

| | | | |
|---|---|---|---|
| CN | 105786230 | A | 7/2016 |
| CN | 106896552 | A | 6/2017 |
| CN | 110543260 | A | 12/2019 |
| CN | 210666726 | U | 6/2020 |

\* cited by examiner

TOUCH SCREEN, DISPLAY PANEL, AND VEHICLE DIAGNOSIS EQUIPMENT

CROSS REFERENCE

The present application is a continuation of PCT Application No. PCT/CN2020/116256, filed Sep. 18, 2020, which claims the benefit of and priority to Chinese patent application No. 201910895135.1 titled "Touch screen, display panel, and vehicle diagnosis equipment," filed Sep. 20, 2019, in the China National Intellectual Property Administration, the entireties of which are hereby incorporated herein by reference.

TECHNICAL FIELD

The present application relates to the field of display technology, and in particular to a touch screen, a display panel, and vehicle diagnosis equipment.

BACKGROUND ART

Compared with other consumer tablet computers, vehicle diagnostic tablet computers are used in a harsher environment. For example, they are often used in high-temperature and high-humidity repair shops, and sun exposure or cold weather in the outdoors, and most of the users' hands are stained with oil or sweat. There is a need for more stable and reliable functioning of the components of a vehicle diagnostic tablet computer to ensure longer service life. This includes a touch screen that is most touched when using the tablet computer.

In carrying out the present invention, the inventors have found that the related art has at least the problems as follows: there is no special grounding treatment for the touch screen inside the tablet computer. When the touch screen is used for a long time in the above-mentioned harsh environment, the peripheral wires are prone to burnout due to short circuit or electrostatic breakdown, resulting in abnormal function or complete failure of the touch screen.

SUMMARY OF THE INVENTION

In order to solve the above-mentioned technical problem, embodiments of the present invention provide a touch screen, a display panel, and vehicle diagnosis equipment that prevent burnout due to short circuit or electrostatic breakdown and improve the anti-static performance.

In order to solve the above technical problem, embodiments of the present invention provide the following technical solutions: a touch screen applied to the vehicle diagnosis equipment; wherein the touch screen comprises: a touch assembly comprising a touch function layer and a flexible circuit board, wherein the touch function layer is electrically connected to the flexible circuit board, the flexible circuit board is provided with a first grounding portion, and the first grounding portion is electrically connected to the flexible circuit board;

and a metal support for grounding treatment, wherein the metal support is provided with a second grounding portion, and the first grounding portion and the second grounding portion are electrically connected.

Optionally, the flexible circuit board comprises an extension portion partially extending out of the touch function layer, the extension portion is provided with the first grounding portion, and the first grounding portion is electrically connected to the extension portion.

Optionally, the extension portion can bend toward a position direction of the second grounding portion so that the first grounding portion provided on the extension portion is connected to the second grounding portion.

Optionally, the first grounding portion comprises a metal sheet and a conductive layer, the metal sheet being provided on a surface of the extension portion, one side of the conductive layer being stacked on the surface of the metal sheet, and the other side of the conductive layer being connected to the second grounding portion.

Optionally, the first grounding portion further comprises an adhesive layer, the first grounding portion being bonded to the second grounding portion via the adhesive layer.

Optionally, one side of the adhesive layer and one side of the conductive layer are both stacked on the same surface of the metal sheet, and the other side of the adhesive layer and the other side of the conductive layer are both connected to the second grounding portion.

Optionally, the surface of the metal sheet away from the extension portion comprises a first area and a second area, the first area and the second area having the same area;
the adhesive layer is adhered to the first area and the conductive layer is adhered to the second area.

Optionally, the adhesive layer is a 3M double-sided adhesive and the conductive layer is a conductive double-sided adhesive.

Optionally, the second grounding portion has a boss shape and is provided on one side of the metal support away from the flexible circuit board.

Optionally, the boss is subjected to a laser etching conductive treatment.

Optionally, the touch function layer comprises a cover plate layer and a sensing layer, and the sensing layer and the touch assembly are successively stacked on the cover plate layer;
the sensing layer comprises a first sensing layer and a second sensing layer, wherein the first sensing layer comprises a first glass layer and a first conductive film, the first conductive film is stacked on the first glass layer, and the first conductive film is provided with an electrode wire;
the second sensing layer comprises a second glass layer and a second conductive film, the second conductive film, and the second glass layer are successively stacked on the surface of the first conductive film away from the first glass layer, and the second conductive film is provided with the electrode wire.

Optionally, a sealing structure is provided at an edge between the first sensing layer and the second sensing layer, the sealing structure, the first sensing layer, and the second sensing layer forming a sealing cavity therebetween, and the sealing cavity being filled with a sealing material.

In order to solve the above technical problem, embodiments of the present invention provide the following technical solutions: a display panel. The display panel comprises:
a display screen and the above touch screen, the display screen being stacked between the touch assembly and the metal support.

In order to solve the above technical problem, embodiments of the present invention provide the following technical solutions: vehicle diagnosis equipment. The vehicle diagnosis equipment comprises:
a housing; and
the above display panel, wherein the display panel is provided within the housing.

Compared with the prior art, embodiments of the present invention provide a touch screen, wherein the touch screen comprises a touch assembly and a metal support. The touch assembly comprises a touch function layer and a flexible circuit board, the touch function layer is electrically connected to the flexible circuit board, the flexible circuit board is provided with a first grounding portion, and the first grounding portion is electrically connected to the flexible circuit board; the metal support is grounded, the metal support is provided with a second grounding portion, and the first grounding portion and the second grounding portion are electrically connected. By providing a first grounding portion on the flexible circuit board, and electrically connecting the first grounding portion with the flexible circuit board, and at the same time providing a second grounding portion on the metal support, and electrically connecting the first grounding portion and the second grounding portion, the grounding treatment of the touch assembly is realized, so that peripheral wires are not prone to burnout due to short circuit or electrostatic breakdown, thereby improving the anti-static performance of the touch screen.

BRIEF DESCRIPTION OF THE DRAWINGS

One or more embodiments are illustrated by way of examples with the figures in the corresponding drawings. These exemplary descriptions do not constitute a limitation to the embodiments. Elements in the drawings having the same reference numeral designations represent like elements, and the figures in the accompanying drawings are not to scale unless specifically stated.

DETAILED DESCRIPTION OF THE INVENTION

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by a person of ordinary skill in the art without inventive effort fall within the scope of the present invention.

Unless defined otherwise, all technical and scientific terms used herein have the same meaning as commonly understood by one of ordinary skill in the art to which this invention belongs. If there is a description of "first", "second", etc. in an embodiment of the present invention, the description of "first", "second", etc. is for descriptive purposes only and is not to be construed as indicating or implying relative importance or implicitly indicating the number of technical features indicated. Therefore, a feature defined as "first" or "second" may explicitly or implicitly comprise at least one such feature. In addition, the technical solutions between the various embodiments can be combined with each other, but it must be realized by a person of ordinary skill in the art. When the combination of technical solutions appears contradictory or cannot be realized, it should be considered that the combination of technical solutions does not exist and is not within the scope of protection of the present invention.

Unless defined otherwise, all technical and scientific terms used in the description have the same meaning as commonly understood by one of ordinary skill in the art to which this invention belongs. The terms used in the description of the present invention are for the purpose of describing specific embodiments only and are not intended to be limiting of the present invention. As used in the description, the term "and/or" includes any and all combinations of one or more of the associated listed items.

Furthermore, the technical features involved in various embodiments of the present invention described below can be combined as long as they do not conflict with each other.

Figure 1:
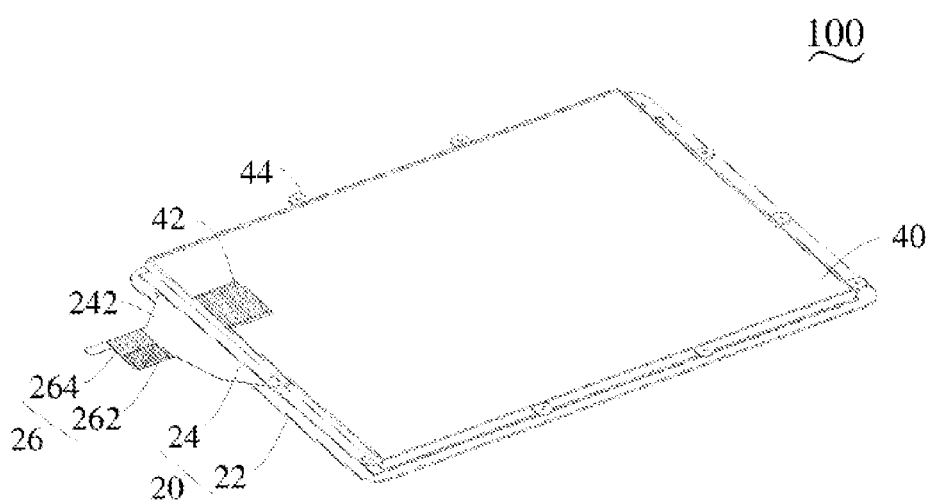
FIG. 1 is a schematic view of a structure of one of the touch screens provided by an embodiment of the present invention, wherein a first grounding portion of the touch screen is not connected to a second grounding portion.
Figure 2:
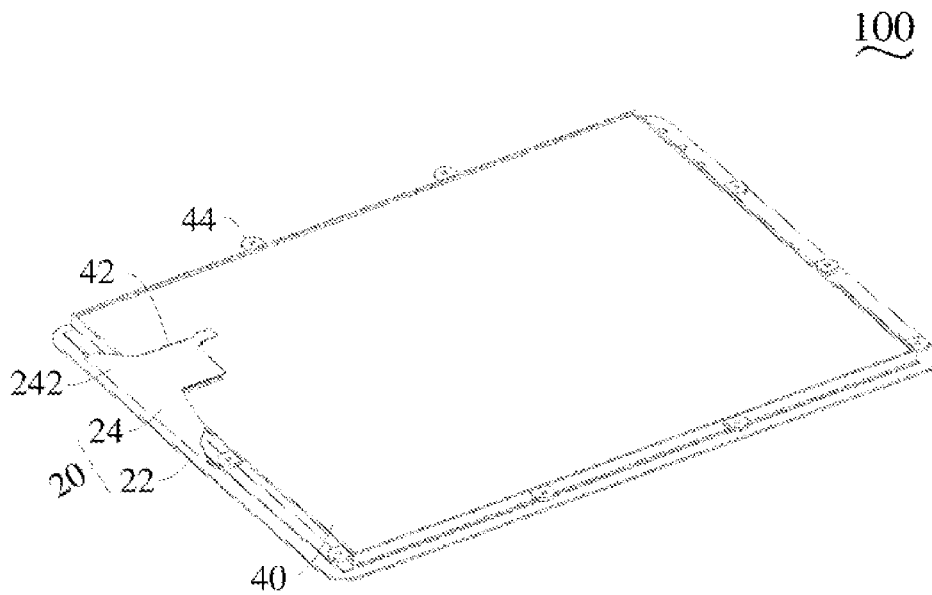
FIG. 2 is a schematic view of a structure of another touch screen provided by an embodiment of the present invention, wherein a first connecting portion of the touch screen is connected to a second grounding portion.

Referring to FIGS. 1 and 2 together, according to an embodiment of the present invention, there is provided a touch screen 100, which is applied to vehicle diagnosis equipment. The touch screen comprises a touch assembly 20 and a metal support 40, wherein the touch assembly 20 is mounted and fixed to the metal support 40, and the metal support 40 contacts an external environment so as to realize the grounding of the metal support 40. For example, when the touch screen 100 is used as a diagnostic touch screen, since a user holds the metal support 40, the metal support 40 contacts a human body, thereby enabling the metal support 40 to realize grounding through the human body.

The touch assembly 20 includes a touch function layer 22 and a flexible circuit board 24, wherein the touch function layer 22 is electrically connected to the flexible circuit board 24.

Figure 3:
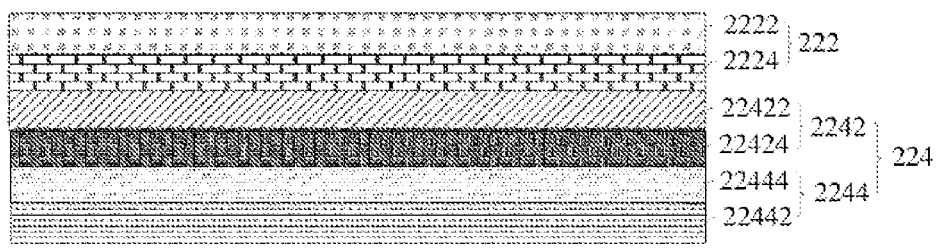
FIG. 3 is a schematic view of a structure of a touch function layer of the touch screen shown in FIG. 1.

Referring to FIG. 3 together, the touch function layer 22 includes a cover plate layer 222 and a sensing layer 224, and the sensing layer 224 and the flexible circuit board 24 are in turn stacked to the cover plate layer 222. In this embodiment, the cover plate layer 222 is adhered to the sensing layer 224 by an adhesive glue layer to protect the sensing layer 224 from scratching. The adhesive glue layer may be an optically clear adhesive (OCA) layer.

The cover plate layer 222 comprises an ultra-thin glass layer 2222 and a substrate 2224, wherein the substrate 2224 is formed on the ultra-thin glass layer 2222, and the ultra-thin glass layer 2222 has bendability; the ultra-thin glass layer 2222 has a good bending property due to its ultra-thin property, and the ultra-thin glass layer 2222 can have a high hardness and/or stiffness on the basis of a good bendability, so as to satisfy the properties of being robust to drops and recovery, etc.

The substrate 2224 serves to increase the hardness of the cover plate layer 222. Since substrate 2224 is formed on the ultra-thin glass layer 2222 and is facing a user, the substrate 2224 may have scratch and abrasion resistance properties while having a preset hardness. Further, when the material of the substrate 2224 is an organic material, the substrate 2224 is provided with bending property so that the bendability of the cover plate layer 222 can be further improved. In some embodiments, the substrate 2224 can also be a 2D, 2.5D, or 3D structured glass substrate 2224. The 2D structure means one pure plane. The glass of this structure is substantially flat with all points of the glass on the same plane. The 2.5D glass screen refers to that although the middle area is also a plane as in the general 2D glass screen, the 2.5D glass uses a cambered surface transition at the edge, i.e. the edge is cambered on the basis of the plane glass. The 3D structured glass refers to the glass with a greater camber of the screen. The display panel using 3D glass and other mobile vehicle diagnosis equipment not only use the cambered surface design for the glass on the surface, but also have a cambered 3D screen on the touch screen 100. In some embodiments, one layer of the isolated layer is formed by coating the surface of the substrate 2224, and then the coating is performed on the isolated layer again to form one layer of photocatalyst layer that is capable of generating superoxide radicals upon exposure to light. When the above-mentioned substrate 2224 is applied to the touch screen 100, the superoxide radicals generated by the photocatalyst under light irradiation can effectively remove harmful substances such as bacteria on the surface of the touch screen 100 and in the grooves of the surrounding decorative rings, thereby solving the problem that currently the touch screen 100 is easy to accumulate bacteria after a long time of use and is not easy to be cleaned.

In the present embodiment, due to the ultra-thin property of the ultra-thin glass layer 2222, the cover plate layer 222 has a good bending property, and at the same time, the substrate 2224 does not affect the bending property of the cover plate layer 222, and at the same time, the hardness of the cover plate layer 222 is increased, so that the cover plate layer 222 composed of the ultra-thin glass layer 2222 and the substrate 2224 together has a good bending property, and at the same time, has the properties of hardness and being robust to drops, etc. and meets the requirements for the cover plate layer 222 in the flexible display screen.

On the basis of ensuring that the cover plate layer 222 has a certain hardness, in order to provide the cover plate layer 222 with better bending property, the thickness of the cover plate layer 222 composed of the ultra-thin glass layer 2222 and the substrate 2224 together ranges from 10 μm to 200 μm, and preferably, the thickness of the cover plate layer 222 ranges from 40 μm to 100 μm.

The ultra-thin glass layer 2222 may be an alkali-containing ultra-thin glass and an alkali-free ultra-thin glass. Specifically, the alkali-containing ultra-thin glass may be soda-lime-silica glass or aluminosilicate glass. The alkali-free ultra-thin glass may be a borate glass.

The ultra-thin glass layer 2222 is thinned (etched) and strengthened (ion exchange) to achieve the requirement of ultra-thin property, and the thickness of the ultra-thin glass layer 2222 may range from 10 μm to 100 μm, and preferably, the thickness of the ultra-thin glass layer 2222 ranges from 50 μm to 75 μm.

In some implementations, the ultra-thin glass layer 2222 has high hardness and/or stiffness at the same time on the basis of bendability so as to meet the properties of being robust to drops and recovery. The surface hardness of the ultra-thin glass layer 2222 ranges from 3H to 9H, and preferably, the surface hardness of the ultra-thin glass layer 2222 ranges from 4H to 7H. The Young modulus (E) of the ultra-thin glass layer 2222 ranges from 10 GPa to 100 GPa, and preferably, the Young modulus (E) of the ultra-thin glass layer 2222 ranges from 50 Gpa to 80 Gpa. The surface flatness of the ultra-thin glass layer 2222 is not more than 10 nm.

The sensing layer 224 comprises a first sensing layer 2242 and a second sensing layer 2244, wherein the first sensing layer 2242 comprises a first glass layer 22422 and a first conductive film 22424, the first conductive film 22424 is stacked on the first glass layer 22422, and the first conductive film 22424 is provided with an electrode wire.

The second sensing layer 2244 comprises a second glass layer 22442 and a second conductive film 22444, the second conductive film 22444 and the second glass layer 22442 are successively stacked on the surface of the first conductive film 22424 away from the first glass layer 22422, and the second conductive film 22444 is provided with an electrode wire. Since the first conductive film 22424 and the second conductive film 22444 are both located between the first glass layer 22422 and the second glass layer 22442, the influence of the external environment can be isolated, so that the first conductive film 22424 and the second conductive film 22444 can be effectively protected, and the reliability of the touch screen 100 can be effectively improved.

The first conductive film 22424 and the second conductive film 22444 are indium tin oxide semiconductor transparent conductive films. In some embodiments, the first conductive film 22424 and the second conductive film 22444 can also use other transparent conductive oxide materials, for example, indium tin oxide (ITO), indium zinc oxide (IZO), zinc oxide (ZnO), indium tin zinc oxide (ITZO), etc.

In some embodiments, a sealing structure is provided at an edge between the first sensing layer 2242 and the second sensing layer 2244, the sealing structure, the first sensing layer 2242 and the second sensing layer 2244 forming a sealing cavity therebetween, and the sealing cavity being filled with a sealing material.

In this embodiment, the gap at the edge between the first sensing layer 2242 and the second sensing layer 2244 forms the sealing structure by silkscreen epoxy resin.

In the present embodiment, the sealing material is a water binder layer, the water binder layer fills the sealing cavity, the water binder layer fills the sealing cavity, and the first sensing layer 2242 and the second sensing layer 2244 are bonded together via the water binder layer. Therefore, the sensing layer 224 is formed as one whole without voids, so that the first conductive film 22424 and the second conductive film 22444 between the first glass layer 22422 and the second glass layer 22442 can be completely isolated from air, and the first conductive film 22424 and the second conductive film 22444 are prevented from being corroded by air.

The flexible circuit board 24 includes at least one welding area connected to an external element and a connecting area connected to the welding area. The welding area is for welding to a high-speed package substrate.

The welding area includes a first layer welding area, a second layer welding area, and a third layer welding area that are successively stacked. The first layer welding area includes a first high-speed pad and a first signal reference ground pad, the second layer welding area includes a second signal reference ground pad, and the third layer welding area includes a third high-speed pad and a third signal reference ground pad. The first high-speed pad and the third high-speed pad are conductive to each other, and the first signal reference ground pad, the second signal reference ground pad, and the third signal reference ground pad are conductive to each other.

The connecting area includes a first connecting wire layer and a second connecting wire layer that are stacked. The first connecting wire layer comprises a first signal transmission connecting line and a first signal reference ground connecting line, and the second layer connecting area comprises a second signal reference ground connecting line which is in mutual conduction with the first signal reference ground connecting line. The first signal transmission connecting line is connected to the first high-speed pad, the first signal reference ground connecting line is connected to the first signal reference ground pad, and the second signal reference ground connecting line is connected to the second signal reference ground pad. Here, by designing a three-layer structured flexible circuit board, the problems of impedance discontinuity and long return path caused by the two-layer circuit board in the prior art can be solved, and the return path of a high-speed signal is greatly shortened, thereby greatly reducing the transmission loss of the high-speed signal and improving the transmission bandwidth. In addition, the welding area is a three-layer wire board and the connecting area is a two-layer wire board, so as to ensure that the flexibility of the flexible circuit board 24 is not affected.

In practical use, when the use environment is relatively harsh, for example, it is often used in high-temperature and high-humidity repair shops, and sun exposure or cold weather in the outdoors, and the user's hands are stained with oil or sweat, since there is no special grounding treatment inside the touch screen 100, after the touch screen 100 is used for a long time in the above-mentioned harsh environment, the peripheral wire is prone to burnout due to short circuit or electrostatic breakdown, resulting in abnormal function or complete failure of the touch screen 100.

Referring to FIGS. 1 and 2 together, in order to solve the above-mentioned problems, in the present embodiment, a first grounding portion 26 is provided on the flexible circuit board 24, and the first grounding portion 26 is electrically connected to the flexible circuit board 24, and meanwhile, a second grounding portion 42 is provided on the metal support 40, and the first grounding portion 26 and the second grounding portion 42 are electrically connected, so as to realize the grounding treatment of the touch assembly 20 so that the peripheral wires are not prone to burnout due to short circuit or electrostatic breakdown, thereby improving the anti-static performance of the touch screen 100.

On the basis of not changing the structure of the original touch screen 100, in order to better electrically connect the first grounding portion 26 and the second grounding portion 42 so as to realize the grounding treatment on the touch assembly 20, the flexible circuit board 24 is partially extended out of the touch function layer 22 so as to form an extension portion 242, and then the first grounding portion 26 is provided on the extension portion 242, and the first grounding portion 26 is electrically connected to the extension portion 242.

Since the flexible circuit board 24 has a bendable property, the extension portion 242 partially extending out of the touch function layer 22 as a part of the flexible circuit board 24 also has a bendable property, so that the extension portion 242 can bend toward the position direction of the second grounding portion 42 so that the first grounding portion 26 provided on the extension portion 242 is connected to the second grounding portion 42. Meanwhile, in order to easily connect the first grounding portion 26 and the second grounding portion 42, the second grounding portion 42 is provided on one side of the metal support 40 near the extension portion.

The first grounding portion 26 includes a metal sheet (not shown) and a conductive layer 262. The metal sheet is provided on the surface of the extension portion 242, one side of the conductive layer 262 is stacked on the surface of the metal sheet, and the other side of the conductive layer 262 is connected to the second grounding portion 42, so that the second grounding portion 42 and the metal sheet are connected through the conductive layer 262, thereby electrically connecting the first grounding portion 26 and the second grounding portion 42.

The conductive layer 262 is a conductive double-sided adhesive, and the conductive double-sided adhesive is preferably a conductive copper foil double-sided adhesive. In some embodiments, other conductive double-sided adhesives, such as conductive aluminum foil double-sided adhesives, may also be adopted for the conductive double-sided adhesive.

The metal sheet is a water-absorbing metal sheet, and therefore the metal sheet can absorb water vapor in the environment, avoiding the corrosion of the flexible circuit board 24 by water vapor, and improving the service life of the touch screen 100. The water-absorbing metal sheet is composed of two layers of a first metal sheet and a second metal sheet of the same shape, overlapping each other. A contact area and a gap area are provided between the first metal sheet and the second metal sheet, and the contact area of the metal sheets fixes the first metal sheet and the second metal sheet to each other; the provision of the contact area allows two relatively thin layers of metal sheets to be bonded tightly to form one metal sheet having a thickness equivalent to that of a conventional radiating fin in appearance to achieve the same mechanical strength as a conventional radiating fin of equivalent thickness without increasing the cost of the metal material.

The gap area between the first metal sheet and the second metal sheet forms a fine and open capillary gap. The gap areas are distributed as a network on the water-absorbing metal sheet, the shape of the gap area being determined by the shape of the contact area. The first metal sheet and the second metal sheet adopt the metal material of the aluminum sheet. The contact area can be formed by physically squeezing a metal sheet, spot welding, and adhesive bonding; the distribution shape of the contact area can be obtained by means of a die for metal machining, and by simply designing the shape of the extrusion roller to the shape of the corresponding contact area and by continuously extruding two layers of metal sheets through the extrusion roller so that it can be suitable for mass production and can reduce costs.

In some embodiments, the metal sheet may also be a steel sheet and the like.

The conductive double-sided adhesive has the function of conducting the metal sheet to the metal support 40, but the adhesive property is poor due to the doping of the conductive substance. Therefore, in order to increase the adhesion between the metal sheet and the second grounding portion 42, the first grounding portion 26 further includes an adhesive layer 264 by which the first grounding portion 26 is better adhered to the second grounding portion 42. It could be understood that one side of the adhesive layer 264 and one side of the conductive layer 262 are stacked on the same surface of the metal sheet, and the other side of the adhesive layer 264 and the other side of the conductive layer 262 are connected to the second grounding portion 42.

In order to balance the conductivity of the conductive layer 262 and the adhesiveness of the adhesive layer 264, it is preferable that the surface of the metal sheet away from the extension portion 242 comprises a first area and a second area, the areas of the first area and the second area being the same; the adhesive layer 264 is adhered to the first area and the conductive layer 262 is adhered to the second area.

Here, in the present embodiment, the adhesive layer 264 is a 3M double-sided adhesive. The 3M double-sided adhesive can be a PET substrate double-sided adhesive, and can also be other types of 3M double-sided adhesive, such as a non-woven fabrics substrate double-sided adhesive and a non-substrate double-sided adhesive, etc.

The metal support 40 is a magnesium alloy support or an aluminum alloy support and the like. The shape of the metal support 40 is the same as the shape of the touch function layer 22 in the touch assembly 20, for example, the shape of the touch function layer 22 is a square, and the shape of the metal support 40 is correspondingly set as a square; as another example, the shape of the touch function layer 22 is circular, and the shape of the metal support 40 is correspondingly set to be circular.

A fixing portion 44 is provided on an edge, a side wall, or a surface away from the flexible circuit board 24 of the metal support 40, and the fixing portion 44 can fixedly connect the metal support 40 to a housing. It can be understood that the housing needs to be grounded, and the flexible circuit board 24 is electrically connected to the metal support 40 via the first grounding portion 26 and the second grounding portion 42, and at the same time, the metal support 40 is connected to the grounded housing, so as to realize the grounding treatment for the touch assembly 20, so that peripheral wires are not prone to burnout due to short circuit or electrostatic breakdown, thereby improving the anti-static performance of the touch screen 100.

The fixing portion 44 may be a screw hole, and in the present embodiment, the metal support 40 is fixedly connected to the housing by means of a screw or bolt adapted to the screw hole. In some embodiments, other fixing means may also be adopted, such as welding and the like.

The second grounding portion 42 is provided on one side of the metal support 40 away from the flexible circuit board 24. In order to easily adhere the conductive layer 262 and the adhesive layer 264 of the first grounding portion 26 to the second grounding portion 42 so as to achieve the electrical connection between the flexible circuit board 24 and the second grounding portion 42, in the present embodiment, the second grounding portion 42 is provided in a boss shape, and the conductive layer 262 and the adhesive layer 264 are adhered or attached to a convex surface of the second grounding portion 42.

In order to improve the conductivity of the boss-shaped second grounding portion 42, the convex surface of the second grounding portion 42 is subjected to a laser etching conductive treatment. Specifically, in order to prevent poor conduction (oxidation or residue) of the convex surface of the second grounding portion 42, it is necessary to perform a laser etching treatment on the convex surface to remove the surface film or the anode layer. If the second grounding portion 42 is an aluminum alloy, the resistance of the convex surface after the laser etching is less than 1 ohm, and if the second grounding portion 42 is a magnesium alloy, the resistance of the convex surface after the laser etching is less than 2 ohm.

An embodiment of the present invention also provides a display panel comprising: a display screen and the touch screen 100 as in any one of the above embodiments, the display screen being stacked between the touch assembly 20 and the metal support 40.

The display screen may be a liquid crystal display screen (TFT-LCD) or an OLED (Organic Light-Emitting Diode) display screen. The display screen comprises a light-emitting layer and a driving layer, wherein the driving layer is used for driving the light-emitting layer, the driving layer is stacked on the ultra-thin touch control structure, and the light-emitting layer is stacked on the driving layer.

The light-emitting layer serves as an emission light source for generating the emission light. The light-emitting layer comprises an organic functional layer, a cathode, and an anode. The organic functional layer is stacked between the cathode and the anode to generate the emission light. The organic functional layer is prepared by doping a host material with a certain proportion of organic light-emitting material. When an external voltage is applied, holes of the anode migrate to the organic functional layer, electrons of the cathode migrate to the organic functional layer, electrons and holes meet in the organic functional layer to form an electron-hole pair, and electrons transition from an excited state to a ground state to release energy in the form of radiation photons, thereby generating electroluminescence. The organic light-emitting material can select from an organic micromolecule material or an organic macromolecule material to achieve electro luminence.

The driving layer is provided on one side face of the light-emitting layer to drive the light-emitting layer. The driving layer structure and how to scan and drive the light-emitting layer to generate the emission light are technical means in the prior art, and the description thereof will not be repeated here.

An embodiment of the present invention also provides vehicle diagnosis equipment including a housing and the display panel of any of the embodiments described above.

Compared with the prior art, the present invention provides a touch screen, wherein the touch screen comprises a touch assembly and a metal support. The touch assembly comprises a touch function layer and a flexible circuit board, the touch function layer is electrically connected to the flexible circuit board, the flexible circuit board is provided with a first grounding portion, and the first grounding portion is electrically connected to the flexible circuit board; the metal support is grounded, the metal support is provided with a second grounding portion, and the first grounding portion and the second grounding portion are electrically connected. By providing a first grounding portion on the flexible circuit board, and electrically connecting the first grounding portion with the flexible circuit board, and at the same time providing a second grounding portion on the metal support, and electrically connecting the first grounding portion and the second grounding portion, the grounding treatment of the touch assembly is realized, so that peripheral wires are not prone to burnout due to short circuit or electrostatic breakdown, thereby improving the anti-static performance of the touch screen.

Finally, it should be noted that: the above embodiments are merely illustrative of the technical solutions of the present invention, rather than limiting thereto; combinations of technical features in the above embodiments or in different embodiments are also possible within the idea of the present invention, and the steps can be implemented in any order, and there are many other variations of the different aspects of the present invention as described above, which are not provided in detail for the sake of brevity; although the present invention has been described in detail with reference to the foregoing embodiments, those of ordinary skills in the art will appreciate that: the technical solutions disclosed in the above-mentioned embodiments can still be modified, or some of the technical features can be replaced by equivalents; such modifications and substitutions do not depart the essence of corresponding technical solutions from the scope of the technical solutions of various embodiments of the present invention.

The invention claimed is:

1. A touch screen being applied to vehicle diagnosis equipment, the touch screen comprising:
   a touch assembly, wherein the touch assembly comprises a touch function layer and a flexible circuit board, the touch function layer is electrically connected to the flexible circuit board, the flexible circuit board is provided with a first grounding portion, and the first grounding portion is electrically connected to the flexible circuit board;

and a metal support for grounding treatment, wherein the metal support is provided with a second grounding portion, and the first grounding portion and the second grounding portion are electrically connected;

wherein, the second grounding portion has a boss shape and is provided on one side of the metal support away from the flexible circuit board.

2. The touch screen of claim 1, wherein the flexible circuit board comprises an extension portion partially extending out of the touch function layer, the extension portion is provided with the first grounding portion, and the first grounding portion is electrically connected to the extension portion.

3. The touch screen of claim 2, wherein the extension portion can bend toward a position direction of the second grounding portion so that the first grounding portion provided on the extension portion is connected to the second grounding portion.

4. The touch screen of claim 2, wherein the first grounding portion comprises a metal sheet and a conductive layer, the metal sheet being provided on a surface of the extension portion, one side of the conductive layer being stacked on the surface of the metal sheet, and the other side of the conductive layer being connected to the second grounding portion.

5. The touch screen of claim 4, wherein the first grounding portion further comprises an adhesive layer, the first grounding portion being bonded to the second grounding portion via the adhesive layer.

6. The touch screen of claim 5, wherein one side of the adhesive layer and one side of the conductive layer are both stacked on a same surface of the metal sheet, and the other side of the adhesive layer and the other side of the conductive layer are both connected to the second grounding portion.

7. The touch screen of claim 5, wherein
the surface of the metal sheet away from the extension portion comprises a first area and a second area, the first area and the second area having the same area;
the adhesive layer is adhered to the first area and the conductive layer is adhered to the second area.

8. The touch screen of claim 5, wherein the adhesive layer is a 3M double-sided adhesive and the conductive layer is a conductive double-sided adhesive.

9. The touch screen of claim 1, wherein
a convex surface of the second grounding portion is subjected to a laser etching conductive treatment.

10. The touch screen of claim 1, wherein
the touch function layer comprises a cover plate layer and a sensing layer, and the sensing layer and the touch assembly are successively stacked on the cover plate layer;

the sensing layer comprises a first sensing layer and a second sensing layer, wherein the first sensing layer comprises a first glass layer and a first conductive film, the first conductive film is stacked on the first glass layer, and the first conductive film is provided with an electrode wire;

the second sensing layer comprises a second glass layer and a second conductive film, the second conductive film and the second glass layer are successively stacked on the surface of the first conductive film away from the first glass layer, and the second conductive film is provided with the electrode wire.

11. The touch screen of claim 10, wherein
a sealing structure is provided at an edge between the first sensing layer and the second sensing layer, the sealing structure, the first sensing layer, and the second sensing layer forming a sealing cavity therebetween, and the sealing cavity being filled with a sealing material.

12. A display panel, comprising:
a display screen and the touch screen as claimed in claim 1, the display screen being stacked between the touch assembly and the metal support.

13. Vehicle diagnosis equipment, comprising:
a housing; and
the display panel of claim 12, wherein the display panel is provided within the housing.

* * * * *